United States Patent [19]

Moncorge et al.

[11] Patent Number: 5,604,437
[45] Date of Patent: Feb. 18, 1997

[54] DEVICE FOR MEASURING CIRCUIT BREAKER WEAR

[75] Inventors: Jean-Paul Moncorge, Vaulx en Velin; Lionel Lucot, Fleurieux sur L'Arbresle, both of France

[73] Assignee: Gec Alsthom T & D SA, Paris, France

[21] Appl. No.: 376,891

[22] Filed: Jan. 20, 1995

[30] Foreign Application Priority Data

Feb. 1, 1994 [FR] France ................ 94 01072

[51] Int. Cl.⁶ .................................................. G01R 31/02
[52] U.S. Cl. ........................ 324/424; 340/638; 361/113
[58] Field of Search .............................. 324/423, 424; 340/648; 361/113

[56] References Cited

U.S. PATENT DOCUMENTS

| 3,373,350 | 3/1968 | Reece | 324/424 |
|---|---|---|---|
| 3,735,201 | 5/1973 | May | 340/638 |
| 4,351,013 | 9/1982 | Matsko et al. | 324/424 |
| 4,620,156 | 10/1986 | Alvin et al. | 340/638 |
| 4,670,812 | 6/1987 | Doefler et al. | 361/83 |
| 4,780,786 | 10/1988 | Weynachter et al. | 324/424 |
| 4,808,843 | 2/1989 | Hedin | 361/113 |
| 5,223,795 | 6/1993 | Blades | 361/113 |

FOREIGN PATENT DOCUMENTS

| 0155359 | 6/1982 | Denmark | 324/424 |
|---|---|---|---|

OTHER PUBLICATIONS

*Patent Abstracts of Japan*, vol. 017, No. 480 (E–1425) 31 Aug. 1993 & JP–A–05 120 945 (Toshiba) 18 May 1993.
*Patent Abstracts of Japan*, vol. 015, No. 507 (P–1291) 20 Dec. 1991 & JP–A–03 220 471 (Mitsubishi) 27 Sep. 1991.
French Search Report FR 9401072.

*Primary Examiner*—Maura K. Regan
*Attorney, Agent, or Firm*—Sughrue, Mion, Zinn, Macpeak & Seas

[57] ABSTRACT

A device for measuring circuit breaker wear by integrating the square of the current to be interrupted, said circuit breaker including a control that is actuated by a trip coil. The device includes a timing delay circuit that is actuated by a signal corresponding to a change in the driven or non-drive state of the trip coil, the timing delay circuit causing integration to begin after time has elapsed that is equal to the mechanical delay of the circuit breaker, which mechanical delay is a previously-measured data item. The device further includes a circuit that delivers a signal proportional to the current carried by the circuit breaker, a circuit that squares the signal, and that applies said square to the integrator, said integration being performed for a given length of time that is longer than the maximum arcing time of the circuit breaker, which maximum arcing time is likewise a previously measured data item, the result of the integration being applied to a summing circuit.

6 Claims, 2 Drawing Sheets

DEVICE FOR MEASURING CIRCUIT BREAKER WEAR

The present invention relates to a novel device for measuring circuit breaker wear.

BACKGROUND OF THE INVENTION

In order to maintain a plurality of circuit breakers, it is necessary to have permanently updated information about the state of wear of each of the circuit breakers.

Methods are known that enable circuit breaker wear to be estimated by measuring interrupted current.

Studies have shown that circuit breaker wear is proportional to the sum of the integrals over the duration of the arc, of the square of each interrupted current.

A first method consists in measuring the value of the current immediately prior to the circuit breaker opening (e.g. the peak current) and in accumulating over the lifetime of the circuit breaker the squares of the amps that have been interrupted.

That method is relatively easy to implement, but it is not accurate, since although it takes account of the magnitude of the interrupted current, it does not take account of the time actually taken by the circuit breaker to interrupt the current.

It is possible to use another method that is more accurate but more difficult to implement, in which, for each pole of a given circuit breaker, the integral of the square of the current interrupted by the current breaker is calculated over the successive operating times of the circuit breaker.

That method is considered as being difficult to implement since it requires accurate knowledge of the (short) length of time during which arcing actually takes place.

It is possible, for example, to monitor the presence of an arc by means of a system that makes use of an optical fiber and a photoelectric cell. However that solution is very expensive for a circuit breaker of new design and it is totally inapplicable to circuit breaker models that are already in existence.

OBJECTS AND SUMMARY OF THE INVENTION

An object of the present invention is to define a device that enables the difficulties encountered in the prior art to be mitigated.

According to the main characteristic of the invention, the integral of the square of current over the duration of arcing is initiated after a time delay of given duration has elapsed, starting from the instant at which the order was given to trip the circuit breaker. The tripping order gives rise to the appearance of a voltage across the tripping coil of the circuit breaker. If the circuit breaker operates on lack of applied voltage, then it is the disappearance of the voltage on the coil that marks the beginning of the time period. The duration of the time period is equal to the "mechanical delay" of the circuit breaker, i.e. the time between the appearance of the order indicating that the circuit breaker should open and actual separation of its contacts.

There is no way of obtaining accurate knowledge about the arcing time, however it may be observed that once the arc has disappeared, the circuit breaker has achieved interruption and the current is zero. There is therefore no need to stop integration at exactly the instant at which arcing stops. Integration can be allowed to continue over a further period of time without that altering the value of the integral. In practice, integration is chosen to take place over twice the maximum arcing duration, for example.

The invention thus provides a device for measuring circuit breaker wear by integrating the square of the current to be interrupted, said circuit breaker including a control that is actuated by a trip coil, the device comprising a timing circuit that is actuated by a signal corresponding to a change in the driven or non-driven state of the trip coil, the timing circuit causing integration to begin after time has elapsed that is equal to the mechanical delay of the circuit breaker, which mechanical delay is a previously-measured data item, the device comprises a circuit that delivers a signal proportional to the current carried by the circuit breaker, a circuit that squares that signal, and that applies said square to the integrator, said integration being performed for a given length of time that is longer than the maximum arcing time of the circuit breaker, which maximum arcing time is likewise a previously measured data item, the result of the integration being applied to a summing circuit.

In a preferred embodiment, the timing circuit, the squaring circuit, and the integrator are implemented in the form of a programmed microprocessor.

Advantageously, the summing circuit includes a non-volatile type memory, e.g. of the EEPROM type.

In a particular embodiment, the circuit providing the microprocessor with the signal proportional to the current through the circuit breaker comprises two systems having gains in the ratio of 1 to 16.

BRIEF DESCRIPTION OF THE DRAWINGS

The invention is described in greater detail with reference to the accompanying drawings, in which.

MORE DETAILED DESCRIPTION

Figure 1:
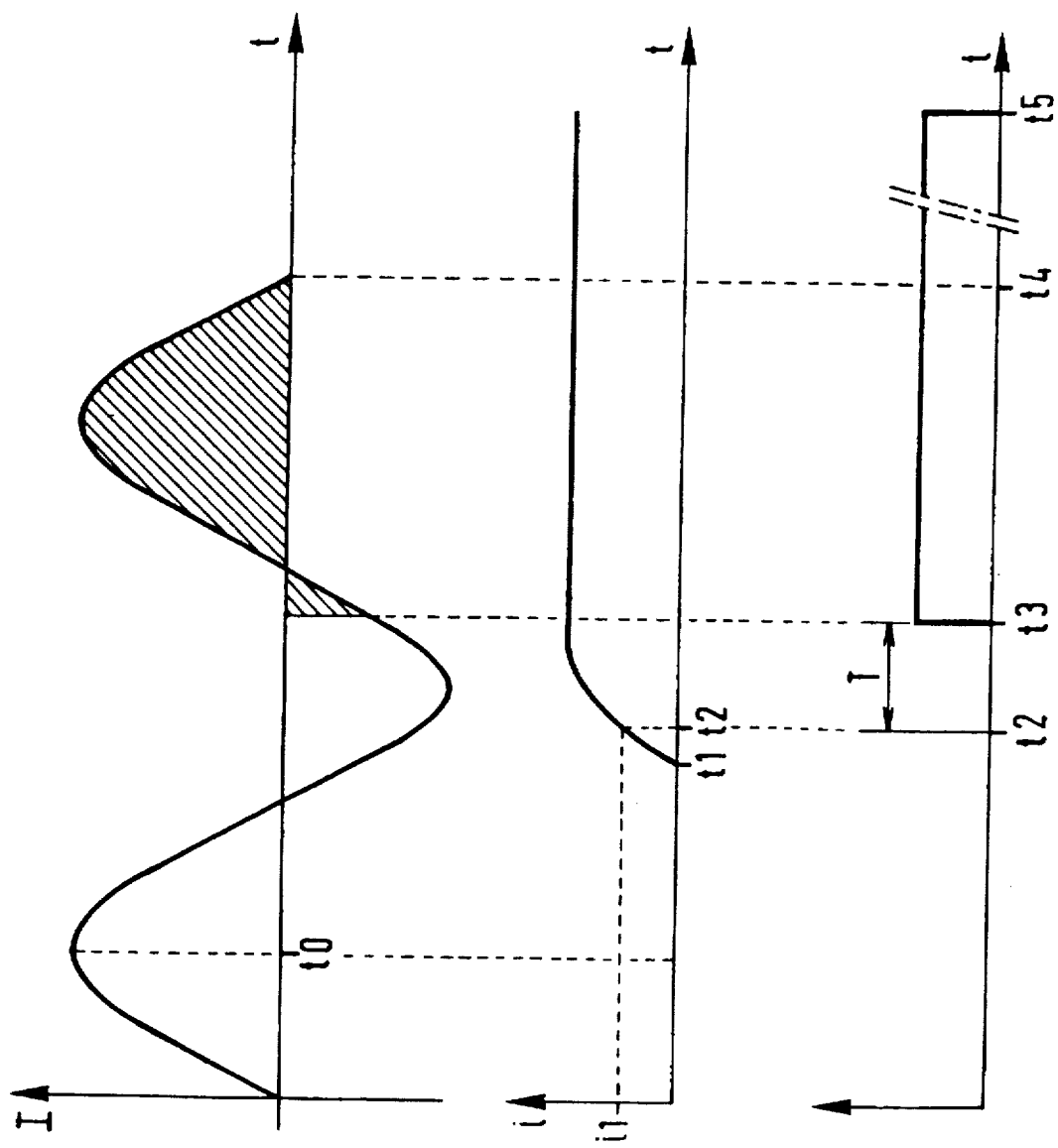
FIGS. 1a to 1c are timing diagrams showing the timing of operation of the device of the invention.

FIG. 1a shows variation in the current I flowing through the circuit breaker. It is assumed that at instant t0 an order is given to open the circuit breaker. This order gives rise, at an instant t1, to the beginning of an increase in the current i flowing through the trip coil of the circuit breaker (FIG. 1b). The presence of this current is detected at an instant t2, once it reaches a threshold value i1. At this instant t2, timing of duration T is started. The time T of the timing is chosen to be equal to the time required, starting from instant t1, to allow the arcing contacts of the circuit breaker to begin separating. By way of example, for a 240 kV circuit breaker, this length of time is about 15 ms.

At instant t3, after the end of the time period corresponding to the circuit breaker arcing contacts opening and thus corresponding to the appearance of an arc, integration of the square of the current is begun (FIG. 1c). This integration is continued beyond instant t4 that corresponds to a zero crossing and on until an instant t5 that corresponds, for example, to twice the "arcing time". The term "arcing time" is used to designate the time that elapses between the arc appearing and the arc being extinguished. By way of example, for a high tension circuit breaker whose "arcing time" is 20 ms, the selected Integration time will be 40 ms.

Figure 2:
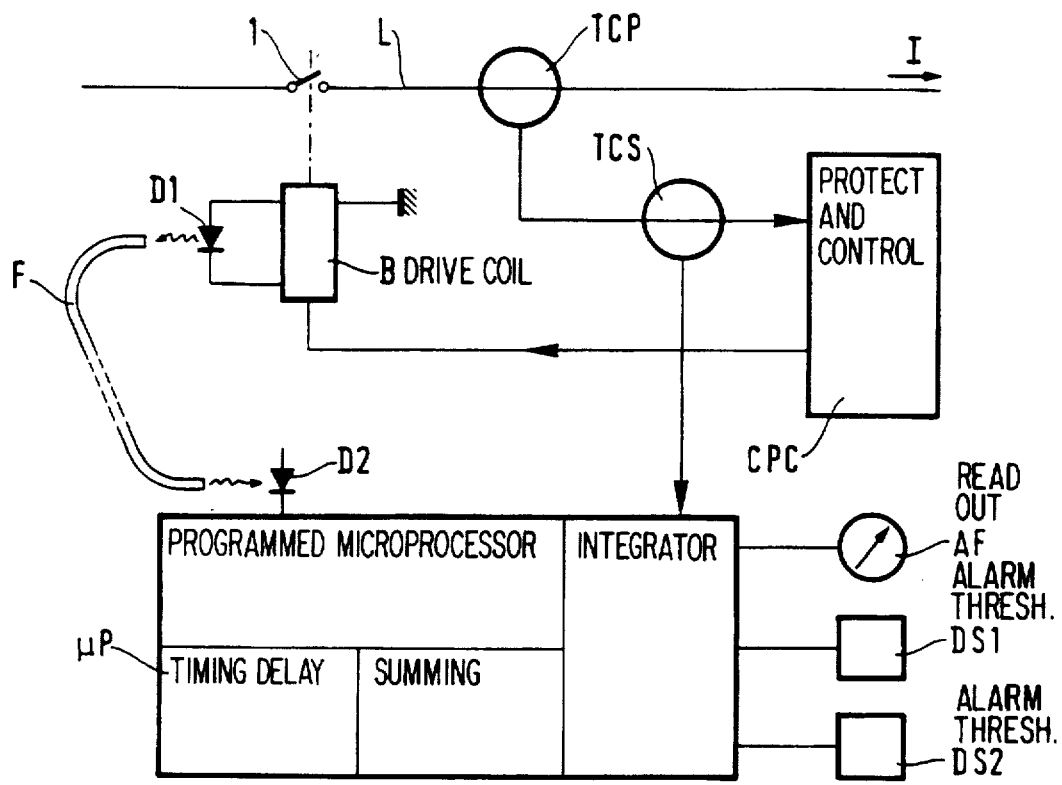
FIG. 2 is a block diagram of a device of the invention.

FIG. 2 is a diagram of the device of the invention. This figure shows elements that relate to one phase only of the circuit breaker. Naturally, the other phases are provided with identical elements.

Reference 1 designates one of the poles of the circuit breaker that is included in a line L and that carries a current I while in operation. A current-measuring torus TCP delivers information representative of the measured current to a protection and control circuit CPC. This circuit delivers current to a pole drive coil B. The coil may be driven in the event of a fault, for example, but it may also be driven merely under normal circumstances, in order to close the circuit breaker. A flow of current through the coil B is detected, for example, by a light-emitting diode (LED) D1 placed across the terminals of the coil B. The LED signals information in the form of light via an optical fiber to a second diode D2 that converts it into an electrical signal which is applied to a programmed microprocessor μP. As mentioned above, the microprocessor starts the timing. A current measuring device TCS which is advantageously a second torus placed on the circuit of the main torus TCP, serves to provide the microprocessor with a signal proportional to the current I carried by the line. The microprocessor serves to square the current and to integrate the square of the current after the time delay has elapsed and throughout the duration mentioned above.

The microprocessor is preferably a model that includes a multiplexed analog-to-digital converter.

The microprocessor calculates the wear percentage of the circuit breaker. It is capable of driving a display circuit AF having analog or digital readout which shows the accumulated result of the integrations performed during each of the opening operations of the circuit breaker and which may also indicate the wear percentage of the circuit breaker.

The microprocessor can also drive threshold devices such as DS1 and DS2 which are organized to issue an alarm whenever given wear percentages t1 and t2 are reached.

Because of the large dynamic range required to measure current (e.g. 0.3 In to 30 In under symmetrical conditions, and 60 In with a 100% aperiodic component, where In is the nominal line current), the dynamic range of the current is about 60/0.3=about 200, thereby giving rise to a dynamic range for $I^2$ of $200^2$=40,000. In general, a range of such size cannot be processed as a single range. By splitting the range into two subranges, it is possible to have sub-ranges equal to the square root of 200, i.e. 14.1. In an analog implementation of the invention, that is the figure which would be used, however when using a microprocessor it is preferable to use the value 16. The square of 16 is equal to 256 and multiplication by 256 is equivalent to shifting through one 8-bit byte. To sum up, when the input current is too high, it is attenuated by a factor of 16 so as to make it more convenient to process, with the attenuation of I by a factor of 16 being compensated by multiplying $I^2$ by 256, where such multiplication is performed very easily by shifting through one byte.

Figure 3:
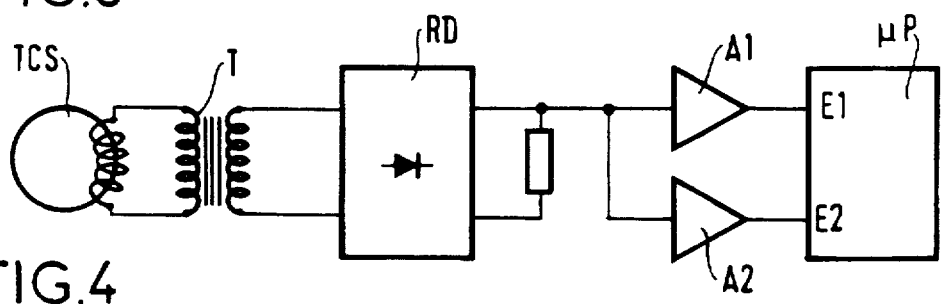
FIG. 3 shows a first embodiment of the circuit that provides a signal proportional to the current flowing through the circuit breaker.

FIG. 3 shows a first embodiment of the circuit enabling the microprocessor to be provided with data item I. The torus TCS is connected via a transformer T to a rectifier bridge RD which feeds two parallel amplifier systems, one having an amplifier A1 of unity gain and the other having an amplifier A2 of gain 1/16, these two systems being connected to respective analog-to-digital inputs E1 and E2 of the microprocessor μP. The microprocessor uses one or other of its inputs depending on the values presented.

Figure 4:
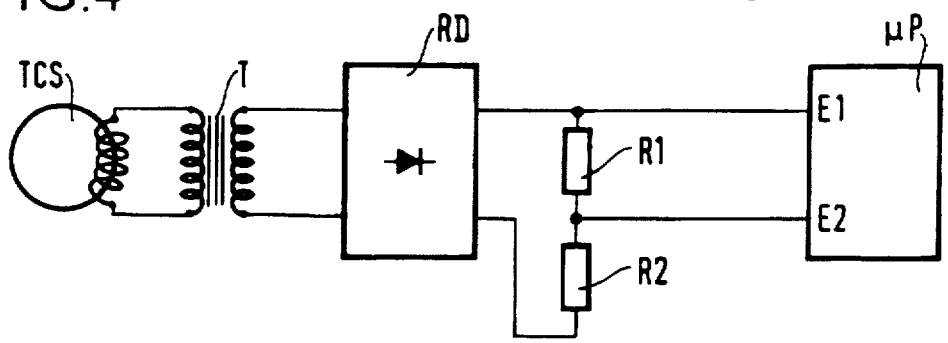
FIG. 4 shows a variant embodiment of the circuit that provides a signal proportional to the current flowing through the circuit breaker.

FIG. 4 shows another embodiment of the circuit for providing data item I to the microprocessor.

This circuit differs from the circuit of FIG. 3 merely in that the amplifiers A1 and A2 are replaced by a divider bridge having two resistors R1 and R2 connected in series and having resistances that are in the ratio 15 to 1.

The program is contained in a read-only memory of the EPROM type.

Accumulated amps squared are stored in a non-volatile memory, e.g. of the EEPROM type, which retains data even in the event of power supply being lost. In a preferred embodiment of the invention, this memory is of the serial EEPROM type ($I^2C$ bus) that makes use of communication over two wires instead of over eight data wires plus 16 address wires as would be required if a parallel memory were used (this achieves great simplification in the printed circuit card).

It will be observed that the same microprocessor can be used for all three phases of the circuit breaker. The microprocessor may be connected, preferably via a serial link, with a PC type computer located remotely from the circuit breaker.

We claim:

1. A device for measuring circuit breaker wear by integrating the square of the current to be interrupted, said circuit breaker including a control that is actuated by a trip coil, the device comprising an integrator, a timing delay means that is actuated by a first signal corresponding to a change in the driven or non-drive state of the trip coil, the timing delay means causing integration to begin after time has elapsed that is equal to the mechanical delay of the circuit breaker, which mechanical delay is a previously-measured data item, the device further comprising a circuit that delivers a second signal proportional to the current carried by the circuit breaker, means for squaring said second signal, and that applies said square to the integrator, said integration being performed for a given length of time that is longer than the maximum arcing time of the circuit breaker, which maximum arcing time is likewise a previously measured data item, the result of the integration being applied to a summer.

2. A device according to claim 1, wherein the timing delay means, the squaring means, and the integrator are implemented within a programmed microprocessor by a program.

3. A device according to claim 2, wherein the summer includes a non-volatile type memory, e.g. of the EEPROM type.

4. A device according to claim 1, wherein the circuit providing said second signal comprises two parallel systems, having respective gains that are in a ratio of 1 to 16.

5. A device according to claim 2, wherein the program is contained in an EPROM type read-only memory.

6. A device according to claim 1, wherein said given length of time is equal to twice the arcing time of the circuit breaker.

* * * * *